(12) United States Patent
Katayama

(10) Patent No.: US 8,643,050 B2
(45) Date of Patent: Feb. 4, 2014

(54) LIGHT EMITTING ELEMENT AND IMAGE DISPLAY APPARATUS USING THE LIGHT EMITTING ELEMENT

(75) Inventor: Ryuichi Katayama, Mintato-ku (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/503,284

(22) PCT Filed: Oct. 6, 2010

(86) PCT No.: PCT/JP2010/067539
§ 371 (c)(1),
(2), (4) Date: Apr. 20, 2012

(87) PCT Pub. No.: WO2011/048951
PCT Pub. Date: Apr. 28, 2011

(65) Prior Publication Data
US 2012/0217529 A1    Aug. 30, 2012

(30) Foreign Application Priority Data
Oct. 22, 2009  (JP) ................................ 2009-243367

(51) Int. Cl.
*H01L 33/00* (2010.01)
*H01L 29/40* (2006.01)
*G02F 1/1335* (2006.01)

(52) U.S. Cl.
USPC ............... 257/98; 257/778; 349/96; 349/114

(58) Field of Classification Search
USPC ................................ 257/778, 98; 349/96, 114
See application file for complete search history.

(56) References Cited

U.S. PATENT DOCUMENTS 5,327,285 A * 7/1994 Faris .................. 359/486.02
6,785,320 B1    8/2004 Amos et al.
(Continued)

FOREIGN PATENT DOCUMENTS

JP    2001-51122 A    2/2001
JP    2001-215444 A    8/2001
(Continued)

OTHER PUBLICATIONS

Christian Hoepfner, "61.1: Invited Paper: PhlatLightTM Photonic Lattice LEDs for RPTV Light Engines", SID Digest, 2006, pp. 1808-1811.
International Search Report for PCT/JP2010/067539 dated Nov. 16, 2010.

*Primary Examiner* — Long K Tran
*Assistant Examiner* — Dzung Tran
(74) *Attorney, Agent, or Firm* — Sughrue Mion, PLLC

(57) ABSTRACT

A light emitting element which can emit light in a uniform polarization state at a high efficiency and a higher luminance level is realized. The light emitting element of the present invention is a light emitting element including an active layer for generating light, the light emitting element including: a polarizer layer including a first region that transmits polarized light in a first direction and reflects other light from among the light generated at the active layer, and a second region that transmits polarized light in a second direction orthogonal to the first direction and reflects other light; a wave plate layer including a third region and a fourth region that allow the lights exited from the first region and the second region to enter, and to exit as light in the same polarization state; and a reflection layer that reflects the lights reflected at the first region and the second region.

10 Claims, 10 Drawing Sheets

(56) References Cited

U.S. PATENT DOCUMENTS

| | | | |
|---|---|---|---|
| 2002/0145689 A1* | 10/2002 | Kaneko | 349/114 |
| 2003/0090607 A1* | 5/2003 | Kamijo | 349/96 |
| 2004/0070829 A1* | 4/2004 | Kurtz et al. | 359/486 |
| 2005/0205884 A1* | 9/2005 | Kim et al. | 257/98 |
| 2005/0213310 A1* | 9/2005 | Takeda | 362/19 |
| 2005/0224826 A1 | 10/2005 | Keuper et al. | |
| 2006/0262397 A1* | 11/2006 | Lee et al. | 359/486 |
| 2007/0081253 A1 | 4/2007 | Yamauchi | |
| 2007/0268490 A1* | 11/2007 | Kawakami et al. | 356/365 |
| 2008/0054283 A1 | 3/2008 | Min et al. | |

FOREIGN PATENT DOCUMENTS

| | | |
|---|---|---|
| JP | 2003-504880 A | 2/2003 |
| JP | 2005-328042 A | 11/2005 |
| JP | 2007-109689 A | 4/2007 |
| JP | 2008-60534 A | 3/2008 |
| JP | 2009-111012 A | 5/2009 |
| JP | 2009-117641 A | 5/2009 |
| JP | 2009-239075 A | 10/2009 |
| WO | 2007/108212 A1 | 9/2007 |

* cited by examiner

LIGHT EMITTING ELEMENT AND IMAGE DISPLAY APPARATUS USING THE LIGHT EMITTING ELEMENT

CROSS REFERENCE TO RELATED APPLICATIONS

This application is a National Stage of International Application No. PCT/JP2010/067539 filed Oct. 6, 2010, claiming priority based on Japanese Patent Application No. 2009-243367 filed Oct. 22, 2009, the contents of all of which are incorporated herein by reference in their entirety.

TECHNICAL FIELD

The present invention relates to a light emitting element that emits light in a uniform polarization state, and an image display apparatus using the light emitting element.

BACKGROUND ART

There is proposed an image display apparatus in which a light emitting diode (LED) is used as the light emitting element. Such a type of image display apparatus is configured to include: a plurality of LEDs that emit each color of red (R), green (G), and blue (B); an illumination optical system into which lights from the plurality of LEDs are made to enter; a light valve having a liquid crystal display board into which the light from the illumination optical system enters; a color synthesis prism that synthesizes the light from the light valve; and a projection optical system for projecting the light from the color synthesis prism to a projection plane.

In an image display apparatus having the above-described configuration, it is desired that optical loss in the optical path from the light emitting element to the light valve is reduced as much as possible to increase the luminance of a projected picture.

Among the above-described components, the liquid crystal display board and the color synthesis prism have a polarization dependence, and to increase the efficiency of the optical system, it is desired that the light emitting element emit light in a uniform polarization state.

Moreover, as described in Non Patent Literature 1, there is restriction by etendue which is determined by the product of the area and the radiation angle of the light emitting element. That is, unless the value of the product of the light emission area and radiation angle of the light emitting element is made equal to or less than the value of the product of the area of incident surface of the light valve and an acceptance angle (solid angle) determined by the F number of the illumination optical system, the light from the light emitting element will not be utilized as the projection light.

For that reason, in an image display apparatus using LEDs, the issue is to reduce the optical loss described above without increasing the emission surface of the light emitting element in order to reduce the etendue of the emitted light of the light emitting element.

Patent Literature 1 (JP2009-111012A) discloses a semiconductor light emitting apparatus in which the surface orientation of the growth principal surface is prescribed for the purpose of achieving light emission having a large polarization ratio.

Patent Literature 2 (JP2007-109689A) discloses a light emitting element, which has as its object providing a light emitting element or the like capable of reducing etendue and supplying light with a high polarization conversion efficiency, and includes a light emitting section that is provided on a reference surface and supplies light, and a structure provided at the emission side of the light emitting section, wherein the structure includes a reflective polarizing plate that transmits polarized light in a first vibration direction, and reflects polarized light in a second vibration direction nearly orthogonal to the first vibration direction, and an optical section that transmits light from the reflective polarizing plate and is formed such that a refractive index changes periodically with respect to a two-dimensional direction substantially parallel with the reference surface.

CITATION LIST

Patent Literature

[Patent Literature 1] JP2009-111012A
[Patent Literature 2] JP2007-109689A
[Patent Literature 3] JP2001-51122A

Non Patent Literature

[Non Patent Literature 1] SID 06 DIGEST, 2006, pp. 1808-1811, 61.1, Photonic Lattice LEDs for RPTV Light Engines, Christian Hoepiher

SUMMARY OF INVENTION

Technical Problem

Since the semiconductor light emitting apparatus described in Patent Literature 1 uses the surface orientation of a growth principal surface, its growth condition is limited and this will lead to productivity issues. This will cause a problem especially when a substrate having a large area is used.

While the light emitting element described in Patent Literature 2 uses a reflective polarization plate to align the polarization orientation of the light to be emitted therefrom, since the light reflected by the reflective polarizing plate is configured to change its vibration direction at a reflection section and since a phase plate is provided closer to the light emitting section than the reflective polarizing plate and since light reenter the reflective polarizing plate, there is a problem in that the efficiency of polarization conversion is poor when considering the attenuation in the reflection, and achieving a high luminance is difficult.

The present invention has been made in view of the above-described problems of related art, and has as its object realizing a light emitting element for emitting light in a uniform polarization state, the light emitting element being easy to fabricate, having good efficiency, and being able to achieve a high luminance.

Solution to Problem

The light emitting element of the present invention is a light emitting element including an active layer for generating light, the light emitting element including:

a polarizer layer including a first region that transmits polarized light in a first direction and reflects other light from among the light generated at the active layer, and a second region that transmits polarized light in a second direction orthogonal to the first direction and reflects other light;

a wave plate layer including a third region and a fourth region that allow the lights exited from the first region and the second region to enter, and to exit as light in the same polarization state; and a reflection layer that reflects the lights reflected at the first region and the second region.

The image display apparatus of the present invention uses a light emitting element of the above-described configuration.

Advantageous Effects of Invention

In the present invention, a polarized light in a first direction and a polarized light in a second direction orthogonal to the first direction are made to exit from the polarizer layer. Since these polarized lights are thereafter made to exit, without being reflected, at the wave plate layer as a light having the same polarization state, they are efficient and can achieve a high luminance.

BRIEF DESCRIPTION OF DRAWINGS

FIG. 18d is a diagram showing the configuration of another exemplary embodiment of the light emitting element, which is a perspective view showing a configuration example of quarter-wave plate layer 1809 in FIG. 18a.

FIG. 18e is a diagram showing the configuration of another exemplary embodiment of the light emitting element, which is a perspective view showing a configuration example of quarter-wave plate layer 1809 in FIG. 18a.

DESCRIPTION OF EMBODIMENTS

Hereafter, specific exemplary embodiments will be described with reference to the drawings.

Figure 1:
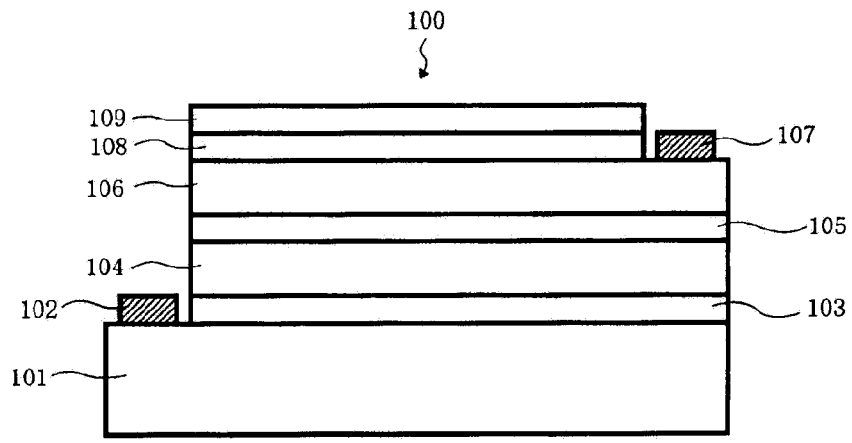
FIG. 1 is a cross-sectional view showing the configuration of an exemplary embodiment of a light emitting element.

FIG. 1 is a cross-sectional view showing the configuration of an exemplary embodiment of light emitting element 100. It is noted that in light emitting element 100, since the actual thicknesses of individual layers are very thin and the differences in the thickness between respective layers are very large, it is difficult to draw a picture of each layer at an accurate scale and proportion. Accordingly, each layer is not drawn to an actual scale in the drawings, and instead, each layer is schematically shown.

P-type electrode 102 made up of Ni/Au/Ti/Au and reflection layer 103 made up of Ag are formed on submount 101 which is made of Si.

P-type semiconductor layer 104 which is made of GaN doped with Mg, active layer 105 in which GaN and InGaN are alternately stacked to constitute a multiple quantum well (MQW), and N-type semiconductor layer 106 which is made of GaN doped with Si are stacked in order on reflection layer 103. N-type electrode 107 made up of Ti/Al/Ti/Au, and polarizer layer 108 are formed on N-type semiconductor layer 106, and further half-wave plate layer 109 is provided on polarizer layer 108.

The method of fabricating light emitting element 100 will be described. First, N-type semiconductor layer 106, active layer 105, P-type semiconductor layer 104, and reflection layer 103 are formed on a substrate. Next, reflection layer 103 is bonded to submount 101 to remove the substrate. Next, polarizer layer 108 is formed on N-type semiconductor layer 106. Half-wave plate layer 109 is formed by a separate process, and bonded onto polarizer layer 108. Lastly, P-type electrode 102 and N-type electrode 107 are formed.

The outline operation of the present exemplary embodiment will be described. Applying a voltage between P-type electrode 102 and N-type electrode 107 to pass an electric current between them will result in the generation of light at active layer 105. The light generated at active layer 105 contains components which are oriented toward various directions.

Both polarizer layer 108 and half-wave plate layer 109 each includes a first region and a second region, and the first region and the second region of polarizer layer 108 are provided so as to correspond to the first region and the second region of half-wave plate layer 109 with respect to the emitted light from light emitting element 100.

The first region of polarizer layer 108 transmits polarized light in the first direction and reflects other light from among light generated at the active layer. The second region of polarizer layer 108 transmits polarized light in a second direction, which is orthogonal to the polarized light in the first direction, and reflects other light. While the light reflected at polarizer layer 108 is reflected at reflection layer 103 toward polarizer layer 108, at this moment, the light is reflected with a certain angle, and therefore it reenters polarizer layer 108 at a position different from the reflection position. For this reason, the light that has reentered polarizer layer 108 includes light that passes through polarizer layer 108.

The first region and the second region of half-wave plate layer 109 are configured to allow an incident light to exit after giving a predetermined polarization rotation angle thereto, and the second region allows the incident light to exit after adding a polarization rotation angle of 90 degrees to the polarization rotation angle of the incident light which is given thereto at the first region. For this reason, the light exited from half-wave plate layer 109 is made to have a uniform polarization orientation.

Hereafter, specific configurations of polarizer layer 108 and half-wave plate layer 109 will be described.

Figure 2:
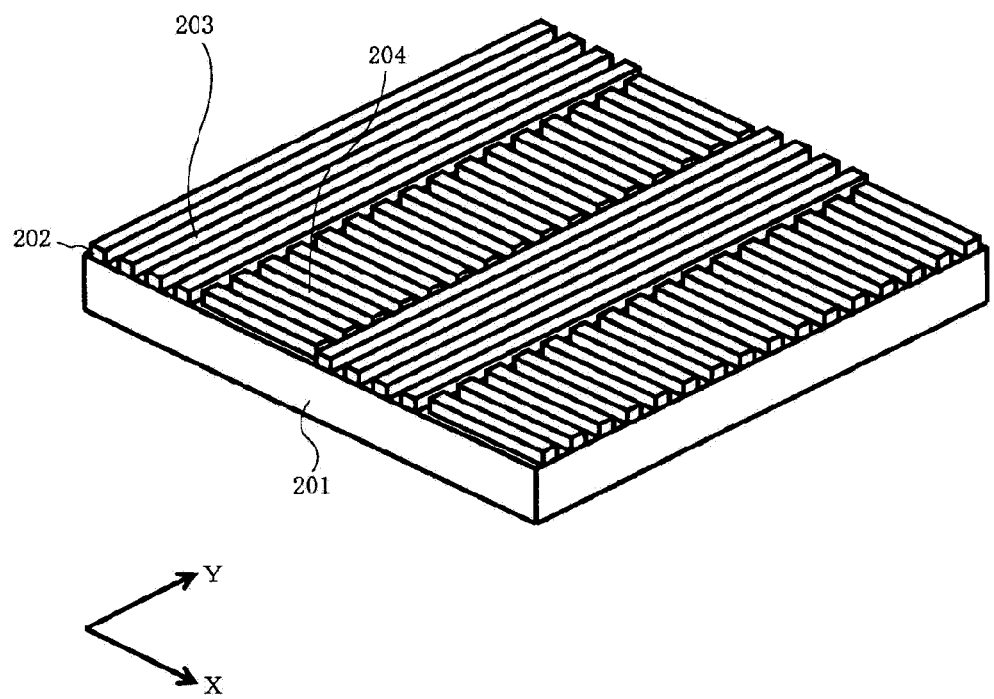
FIG. 2 is a perspective view showing one configuration example of polarizer layer 108 in FIG. 1.

FIG. 2 is a perspective view showing one configuration example of polarizer layer 108 in FIG. 1.

In the example shown in FIG. 2, a polarizer, in which a plurality of metal nanowires 202 made of Al are formed in parallel, is formed on N-type semiconductor layer 201 which is made of GaN doped with Si. Metal nanowire 202 is provided alternately with first region 203 and second region 204, in which longitudinal directions are orthogonal to each other.

First region 203 transmits polarized light in a first direction (X direction), and reflects polarized light in a second direction (Y direction), which is orthogonal to the polarized light in the first direction.

Second region 204 transmits polarized light in the second direction and reflects polarized light in the first direction.

Figure 3:
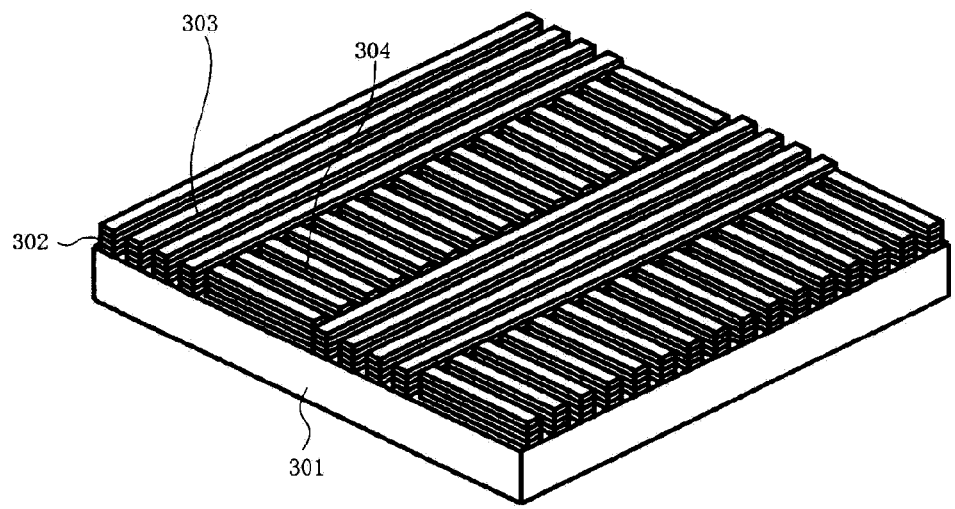
FIG. 3 is a perspective view showing another configuration example of polarizer layer 108 in FIG. 1.
Figure 3:
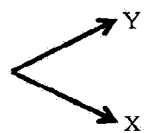

FIG. 3 is a perspective view showing another configuration example of polarizer layer 108 in FIG. 1.

In the example shown in FIG. 3, a polarizer in which a plurality of semiconductors 302, in which GaN and AlN are alternately stacked, are placed in parallel is formed on N-type semiconductor layer 301 which is made of GaN doped with Si. Semiconductor 302 is provided alternately with first region 303 and second region 304, in which longitudinal directions are orthogonal to each other.

First region 303 transmits polarized light in a first direction, and reflects polarized light in a second direction, which is orthogonal to the polarized light in the first direction.

Second region 304 transmits polarized light in the second direction and reflects polarized light in the first direction.

Figure 4:
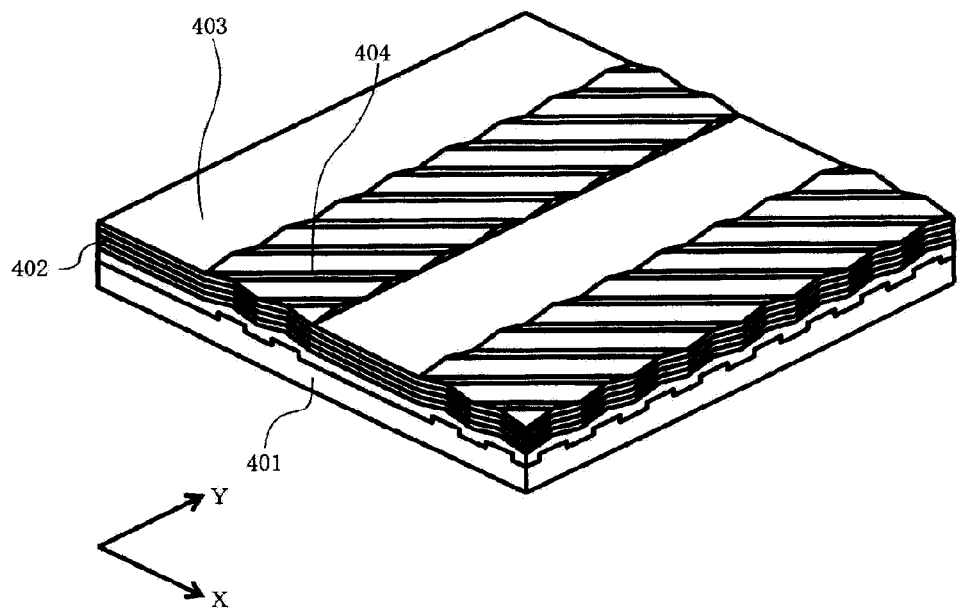
FIG. 4 is a perspective view showing one configuration example of half-wave plate layer 109 in FIG. 1.
Figure 4:
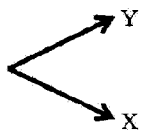

FIG. 4 is a perspective view showing one configuration example of half-wave plate layer 109 in FIG. 1.

In the example shown in FIG. 4, dielectric 402 in which $SiO_2$ and $TiO_2$ are alternately stacked is formed on substrate 401 which is made of quartz. Dielectric 402 is provided with first region 403 and second region 404, which respectively correspond to first regions 203 and 303, and second regions 204 and 304 shown in FIGS. 2 and 3, respectively.

Since first region 403 is formed into a flat shape, it allows the polarized light in the first direction, which has passed through first regions 203 and 303, to pass through as is.

Since second region 404 has a periodic structure, which has a periodic concavo-convex shape in one direction, and a uniform shape in the direction orthogonal thereto, in the XY plane as disclosed in Patent Literature 3 (JP2001-51122A), it acts as a half-wave plate so that the polarized light in the second direction, which has passed through second regions 204 and 304, is converted into a polarized light in the first direction and is made to exit.

To align the polarization orientations of the exiting lights of first region 403 and second region 404, into which lights having orthogonal polarization orientations enter, it becomes necessary for second region 404 to allow the incident light to exit after adding a polarization rotation angle of 90 degrees to the polarization rotation angle of the incident light which is given thereto at first region 403.

In the example shown in FIG. 4, since first region 403 is formed into a flat shape, the polarization rotation angle to be given to incident light becomes 0 degree. The polarization rotation angle to be added by second region 404 is arranged to be 90 degrees such that the angular difference between these orientations is 90 degrees.

As a result, the polarized light that has passed through second regions 204 and 304 is converted into polarized light in the first direction and is made to exit.

Figure 5:
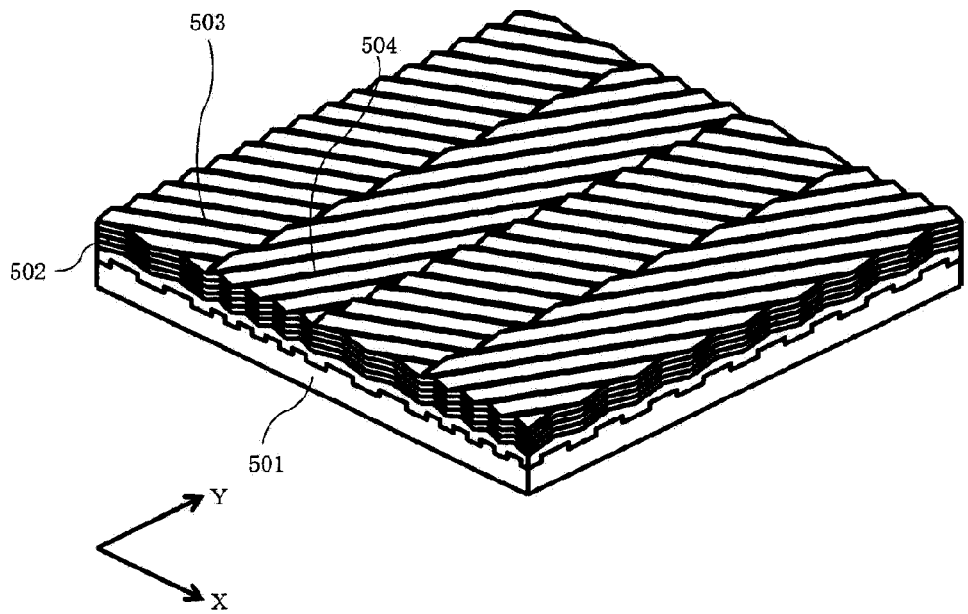
FIG. 5 is a perspective view showing another configuration example of half-wave plate layer 109 in FIG. 1.

FIG. 5 is a perspective view showing another configuration example of half-wave plate layer 109 in FIG. 1.

In the example shown in FIG. 5, dielectric 502 in which $SiO_2$ and $TiO_2$ are alternately stacked is formed on substrate 501 which is made of quartz. Dielectric 502 is provided with first region 503 and second region 504, which respectively correspond to first regions 203 and 303, and second regions 204 and 304 shown in FIGS. 2 and 3, respectively.

Since first region 503 and second region 504 have a periodic structure, which has a periodic concavo-convex shape in one direction, and a uniform shape in the direction orthogonal thereto, in the XY plane as disclosed in JP2001-51122A, they act as a half-wave plate.

To align the polarization orientations of the exiting lights of first region 503 and second region 504, into which lights having orthogonal polarization orientations enter, it becomes necessary for second region 504 to allow the incident light to exit after adding a polarization rotation angle of 90 degrees to the polarization rotation angle of the incident light which is given thereto at first region 503.

In the example shown in FIG. 5, the polarization rotation angle to be given to incident light by first region 503 is arranged to be 45 degrees, and the polarization rotation angle to be added by second region 504 is arranged to be 135 degrees so that the angular difference between these directions is 90 degrees.

As a result, the polarized light in the second direction, which has passed through second regions 204 and 304, is converted into polarized light in the first direction and is made to exit.

Figure 6:
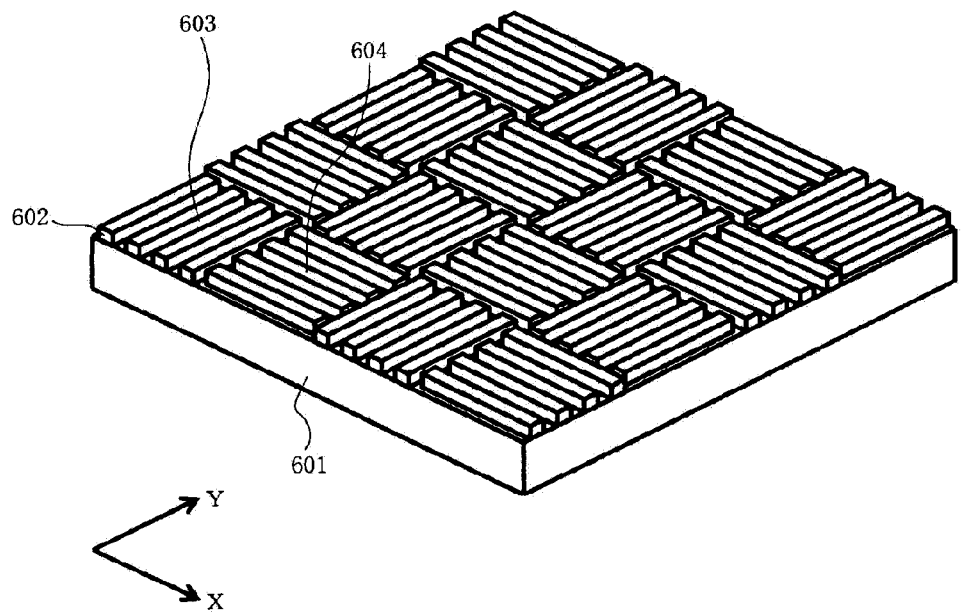
FIG. 6 is a perspective view showing another configuration example of polarizer layer 108 in FIG. 1.

FIG. 6 is a perspective view showing another configuration example of polarizer layer 108 in FIG. 1.

In the example shown in FIG. 6, a polarizer, in which a plurality of metal nanowires 602 made of Al are formed in parallel, is formed on N-type semiconductor layer 601 which is made of GaN doped with Si. Metal nanowire 602 is adjacently provided with first region 603 and second region 604, in which longitudinal directions are orthogonal to each other, in a staggered pattern.

The optical properties of first region 603 and second region 604 are the same as those of first region 203 and second region 204 shown in FIG. 2.

Figure 7:
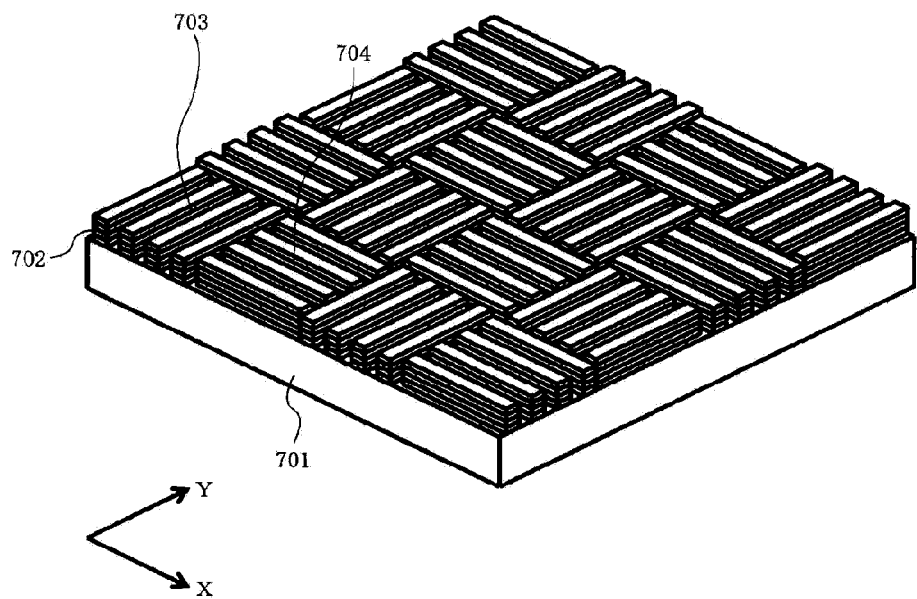
FIG. 7 is a perspective view showing another configuration example of polarizer layer 108 in FIG. 1.

FIG. 7 is a perspective view showing another configuration example of polarizer layer 108 in FIG. 1.

In the example shown in FIG. 7, a polarizer, in which a plurality of semiconductors 702 in which GaN and AlN are alternately stacked are placed in parallel, is formed on N-type semiconductor layer 701 which is made of GaN doped with Si. Semiconductor 702 is adjacently provided with first region 703 and second region 704, in which longitudinal directions are orthogonal to each other, in a staggered pattern.

The optical properties of first region 703 and second region 704 are the same as those of first region 303 and second region 304 shown in FIG. 3.

Figure 8:
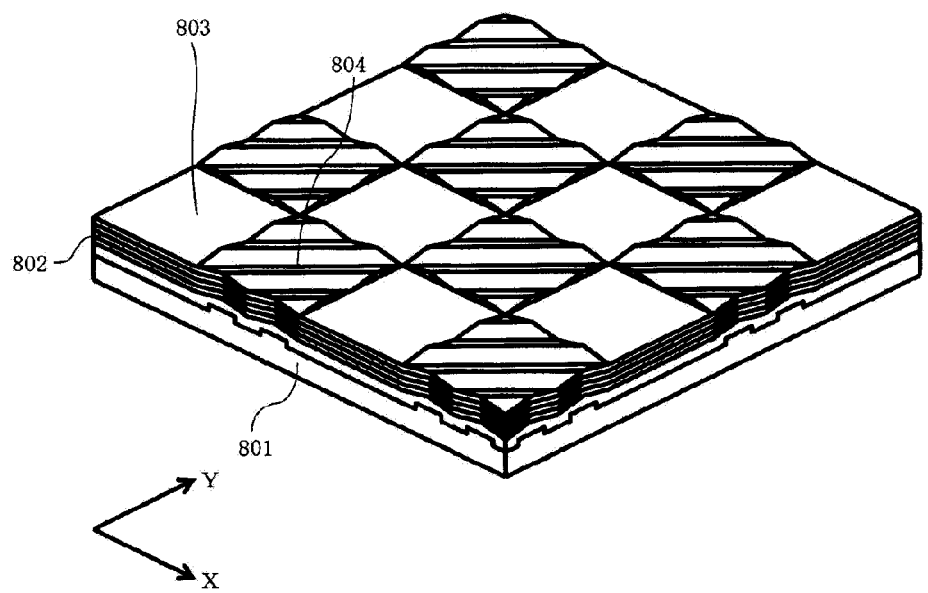
FIG. 8 is a perspective view showing another configuration example of half-wave plate layer 109 in FIG. 1.

FIG. 8 is a perspective view showing another configuration example of half-wave plate layer 109 in FIG. 1.

In the example shown in FIG. 8, dielectric 802 in which $SiO_2$ and $TiO_2$ are alternately stacked is formed on substrate 801 which is made of quartz. Dielectric 802 is provided with first region 803 and second region 804, which respectively correspond to first regions 603 and 703, and second regions 604 and 704 shown in FIGS. 6 and 7, respectively.

Since first region 803 is formed into a flat shape, it allows the polarized light in the first direction, which has passed through first regions 603 and 703, to pass through as is.

Since second region 804 has a periodic structure, which has a periodic concavo-convex shape in one direction, and a uniform shape in the direction orthogonal thereto, in the XY plane as disclosed in JP2001-51122A, it acts as a half-wave plate so that the polarized light in the second direction, which has passed through second regions 604 and 704, is converted into polarized light in the first direction and is made to exit.

To align the polarization orientations of the exiting lights of first region 803 and second region 804, into which light having orthogonal polarization orientations enter, it becomes necessary for second region 804 to allow the incident light to exit after adding a polarization rotation angle of 90 degrees to the polarization rotation angle of the incident light which is given thereto at first region 803.

In the example shown in FIG. 8, since first region 803 is formed into a flat shape, the polarization rotation angle to be given to incident light becomes 0 degree. The polarization rotation angle to be added by second region 804 is arranged to be 90 degrees such that the angular difference between these directions is 90 degrees.

As a result, the polarized light that has passed through second regions 604 and 704 is converted into polarized light in the first direction and is made to exit.

Figure 9:
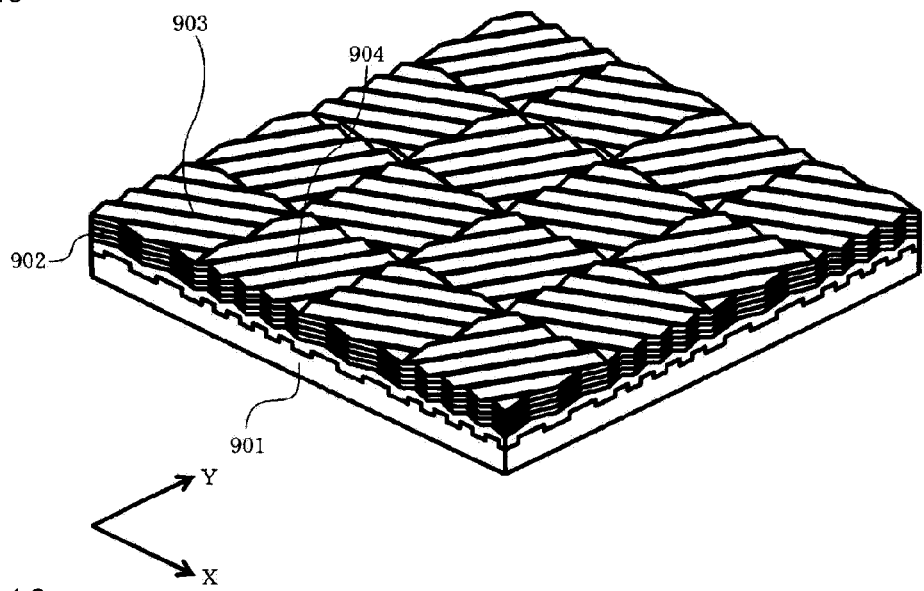
FIG. 9 is a perspective view showing another configuration example of half-wave plate layer 109 in FIG. 1.

FIG. 9 is a perspective view showing another configuration example of half-wave plate layer 109 in FIG. 1.

In the example shown in FIG. 9, dielectric 902 in which $SiO_2$ and $TiO_2$ are alternately stacked is formed on substrate 901 which is made of quartz. Dielectric 902 is provided with first region 903 and second region 904, which respectively correspond to first regions 603 and 703, and second regions 604 and 704 shown in FIGS. 6 and 7, respectively.

Since first region 903 and second region 904 have a periodic structure, which has a periodic concavo-convex shape in one direction, and a uniform shape in the direction orthogonal thereto, in the XY plane as disclosed in JP2001-51122A, they act as a half-wave plate.

To align the polarization orientations of first region 903 and second region 904, into which light having orthogonal polarization orientations enters, it becomes necessary for second region 904 to allow the incident light to exit after adding a polarization rotation angle of 90 degrees to the polarization rotation angle of the incident light which is given thereto at first region 903.

In the example shown in FIG. 9, the polarization rotation angle to be given to incident light by first region 903 is arranged to be 45 degrees, and the polarization rotation angle to be added by second region 904 is arranged to be 135 degrees so that the angular difference between these directions is 90 degrees.

As a result of this, the polarized light in the second direction, which has passed through second regions 604 and 704, is converted into a polarized light in the first direction and is made to exit.

As shown in FIGS. 2 to 5, when the first region and the second region are arranged in a striped pattern, it is possible to facilitate fabrication of the element.

As shown in FIGS. 6 to 9, when the first region and the second region are arranged in a staggered pattern, the way light spreads in X direction becomes similar to the way light spreads in Y direction so that it is possible to achieve an illumination light which has a high uniformity and which is easier to manipulate.

Figure 10:
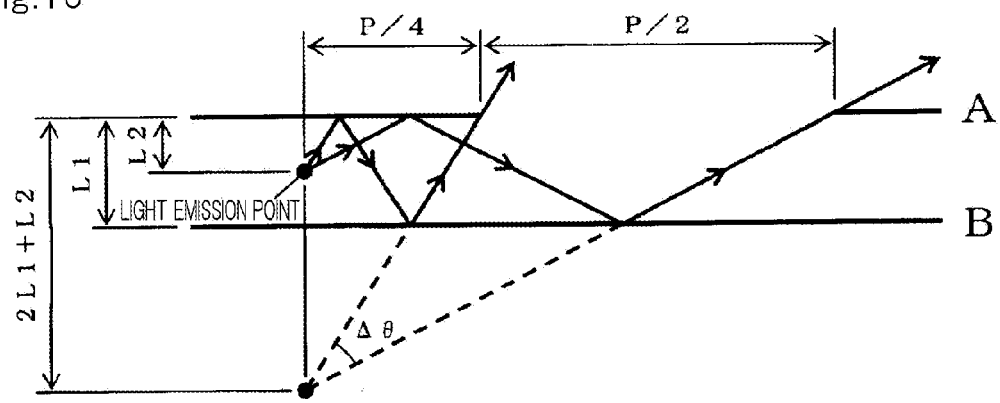
FIG. 10 is diagram to illustrate the period of a first region and a second region which are formed in polarizer layer 108 and half-wave plate layer 109.

FIG. 10 is diagram to illustrate the period of a first region and a second region which are formed in a polarizer layer and a half-wave plate layer.

Although it is desired that the light generated at active layer 105 directly exit from polarizer layer 108 without being reflected, one half of the light is reflected. When the light is reflected multiple times, since it is greatly attenuated and is difficult to be used as illumination light, herein, a periodical structure will be studied, which is suitable for causing the light to be reflected once at reflection layer 103 and exit from polarizer layer 108.

In FIG. 10, the center of polarizer layer 108 in its thickness direction is denoted by A, the center of reflection layer 103 in its thickness direction is denoted by B, and assuming that the widths of the first region and the second region are the same, the sum of the widths of each region is denoted by P. Further, it is assumed that points at which reflection occurs are centers of polarizer layer 108 and reflection layer 103 in respective thickness directions, and the distance between the points is denoted by L1, and the distance from the center (light emission point) of active layer 105 to the center of polarizer layer 108 is denoted by L2. Furthermore, it is assumed that the position of the light emission point in the XY plane is the center of either the first region or the second region where it is most difficult for light to exit after being reflected once.

As shown in FIG. 10, from among the lights that are generated at the light emission point and that exit after being reflected once, the amount of the light that exits after being reflected once increases as angular width $\Delta\theta$, which is the angle formed between the light that exits at the shortest distance and the light that exits at a longest distance, becomes larger. The intersection of each of the exiting lights is at a distance of 2L1+L2 from center A of polarizer layer 108.

Figure 11:
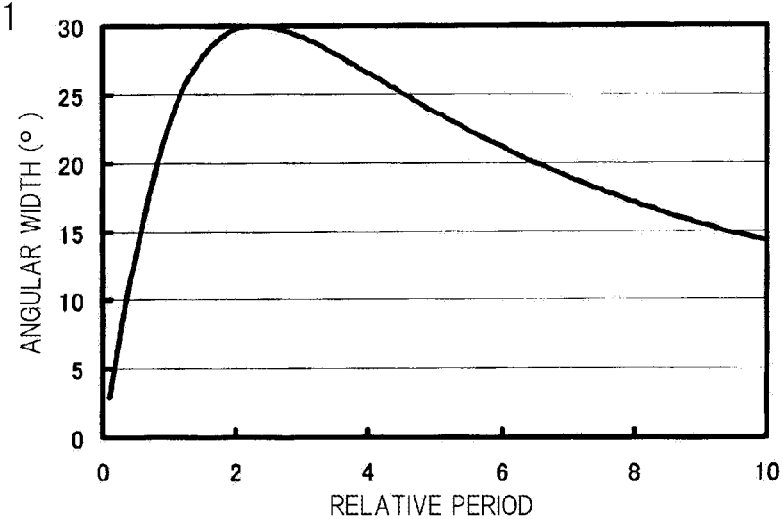
FIG. 11 is a diagram showing the relationship between a relative period and an angular width.

FIG. 11 is a diagram showing the relationship between a relative period, which is shown by P/(2L1+L2), and an angular width, in which it is shown that when the relative period is 2.3, the angular width becomes a maximum of 30°. Further, it is seen that the angular width may be not less than 20° if the relative period is in a range from 0.9 to 6.5, and the angular width may be not less than 25° if the relative period is in a range from 1.2 to 4.5.

When distance L1 between polarizer layer 108 and reflection layer 103 is 3 μm and distance L2 from the center of active layer 105 to the center of polarizer layer 108 is 1.5 μm, in order to get the maximum angular width of 30°, width P which is the sum of the widths of the first region and the second region, may be set to be 17 μm.

Figure 12:
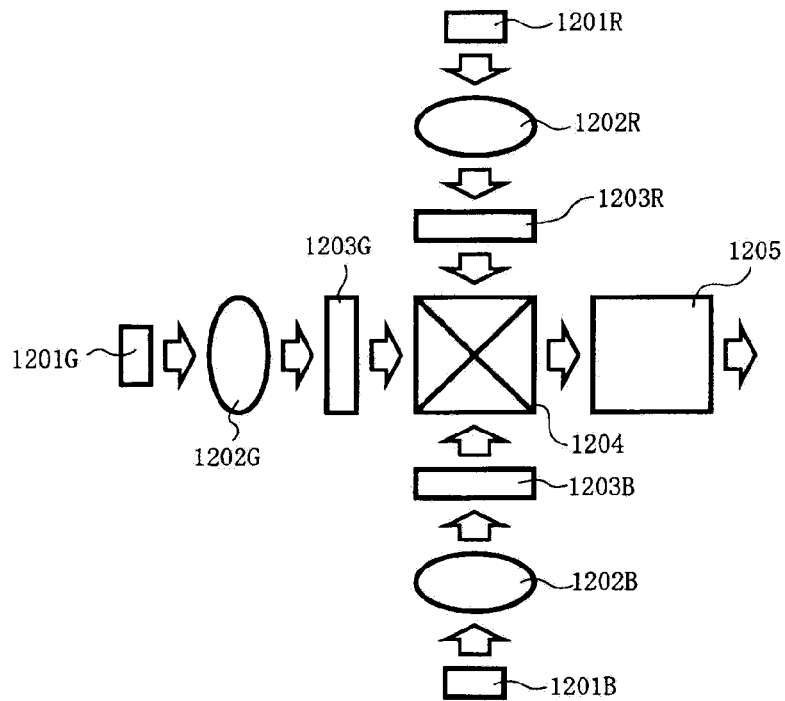
FIG. 12 is a block diagram showing the configuration of one exemplary embodiment of an image display apparatus using a light emitting element.

FIG. 12 is a block diagram showing the configuration of one exemplary embodiment of an image display apparatus using a light emitting element.

An image display apparatus shown in FIG. 12 includes light source unit 1201R that generates a red light, light source unit 1201G that generates a green light, and light source unit 1201B that generates a blue light. Each of these light source units is constructed by using at least one or more of the light emitting elements according to the present invention, which have been described by using FIGS. 1 to 11.

The red light generated at light source unit 1201R irradiates liquid crystal display element 1203R that displays an image for red light, via condenser lens 1202R so that a red image light generated at liquid crystal display element 1203R enters into color synthesis prism 1204.

The green light generated at light source unit 1201G irradiates liquid crystal display element 1203G that displays an image for green light, via condenser lens 1202G so that a green image light generated at liquid crystal display element 1203G enters into color synthesis prism 1204.

The blue light generated at light source unit 1201B irradiates liquid crystal display element 1203B that displays an image for blue light, via condenser lens 1202B so that a blue image light generated at liquid crystal display element 1203B enters into color synthesis prism 1204.

An image light which is synthesized from the entered red image light, green image light, and blue image light at color synthesis prism 1204 is projected via projection lens 1205.

Figure 13:
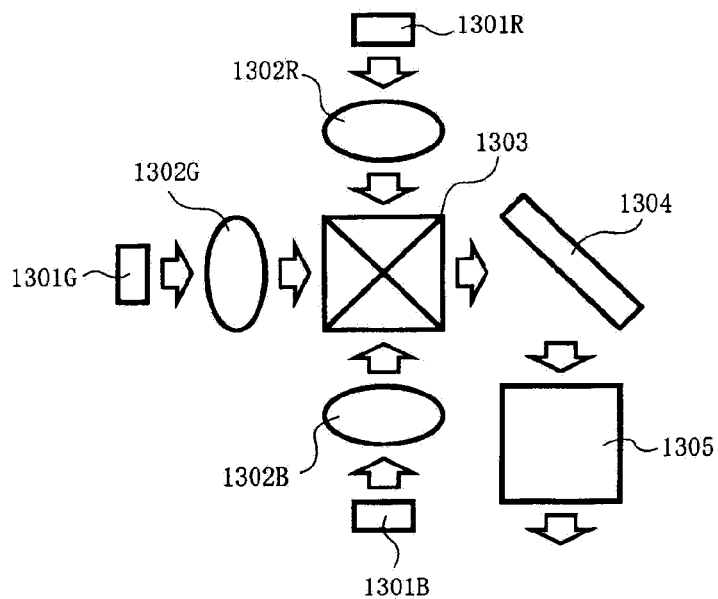
FIG. 13 is a block diagram showing the configuration of another exemplary embodiment of the image display apparatus using the light emitting element.

FIG. 13 is a block diagram showing the configuration of another exemplary embodiment of an image display apparatus using a light emitting element. The image display apparatus of the present exemplary embodiment forms an image by using micromirror 1304 that separately controls the angles of multiple micromirrors.

The image display apparatus of the present exemplary embodiment includes light source unit 1301R that generates a red light, light source unit 1301G that generates a green light, and light source unit 1301B that generates a blue light. Each of these light source units is constructed by using at least one or more of the light emitting elements according to the present invention, which have been described by using FIGS. 1 to 11.

The red light generated at light source unit 1301R enters into color synthesis prism 1303 via condenser lens 1302R. The green light generated at light source unit 1301G enters into color synthesis prism 1303 via condenser lens 1302G. The blue light generated at light source unit 1301B enters into color synthesis prism 1303 via condenser lens 1302B.

Light source unit 1301R, light source unit 1301G, and light source unit 1301B are controlled such that the lit-up state thereof is successively changed over so that a red light, a green light, and a blue light are projected in sequence toward micromirror 1304 from color synthesis prism 1303.

Micromirror 1304 forms an image light according to the colored light with which it is irradiated so that a red image light, a green image light, and a blue image light are projected in sequence via projection lens 1305.

Figure 14:
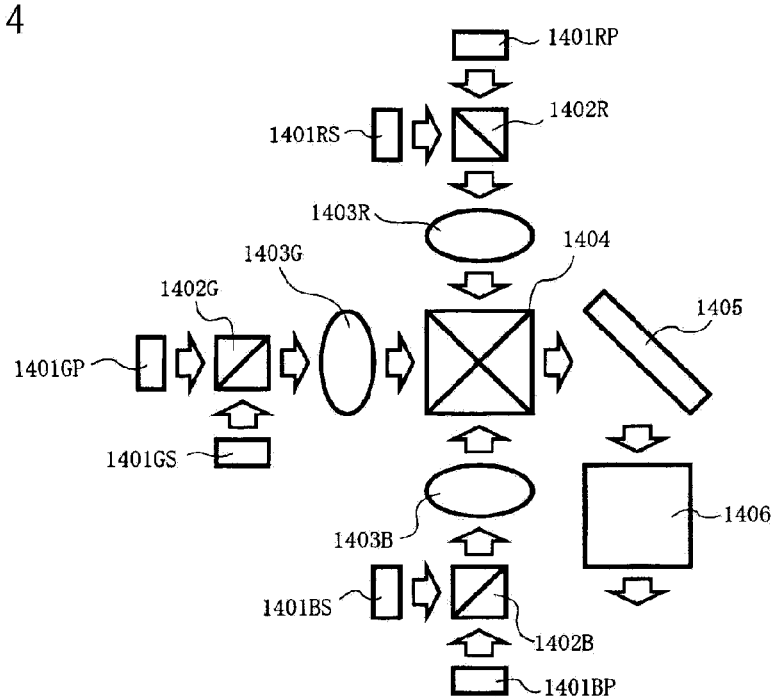
FIG. 14 is a block diagram showing the configuration of another exemplary embodiment of the image display apparatus using the light emitting element.

FIG. 14 is a block diagram showing the configuration of another exemplary embodiment of an image display apparatus using a light emitting element. The image display apparatus of the present exemplary embodiment forms an image by using micromirror 1405 that separately controls the angles of multiple micromirrors.

The image display apparatus of the present exemplary embodiment includes light source units 1401RP and 1401RS that generate P-polarized light and S-polarized light of red color, light source units 1401GP and 1401GS that generate P-polarized light and S-polarized light of green color, and light source units 1401BP and 1401BS that generate P-polarized light and S-polarized light of blue color. Each of these light source units is constructed by using at least one or more of the light emitting elements according to the present invention, which have been described by using FIGS. 1 to 11.

The P-polarized light and S-polarized light of red color which are generated at light source units 1401RP and 1401RS enter into polarization beam splitter 1402R. Polarization beam splitter 1402R transmits the P-polarized light as is, and reflects the S-polarized light. As a result, the P-polarized light and S-polarized light of the red color which are generated at light source units 1401RP and 1401RS are made to exit from polarization beam splitter 1402R.

Similarly, the P-polarized light and S-polarized light of green color which are generated at light source units 1401GP and 1401GS are caused to exit by polarization beam splitter 1402G, and the P-polarized light and S-polarized light of blue color which are generated at light source units 1401BP and 1401BS are caused to exit by polarization beam splitter 1402B.

The lights exited from polarization beam splitter 1402R, polarization beam splitter 1402G, and polarization beam splitter 1402B enter into color synthesis prism 1404 via condenser lenses 1403R, 1403G, and 1403B, respectively.

Light source units 1401RP and 1401RS, light source units 1401GP and 1401GS, and light source units 1401BP and 1401BS are controlled such that the lit-up state of each color is successively changed so that a red light, a green light, and a blue light are projected in sequence toward micromirror 1405 from color synthesis prism 1404. Micromirror 1405 forms an image light according to the colored light with which it is irradiated so that a red image light, a green image light, and a blue image light are projected in sequence via projection lens 1406.

In the image display apparatus of the present exemplary embodiment compared with the image display apparatus shown in FIG. 13, if the number of light emitting elements that constitute each light source unit is the same, the quantity of light is doubled thus enabling a high luminance.

Figure 15:
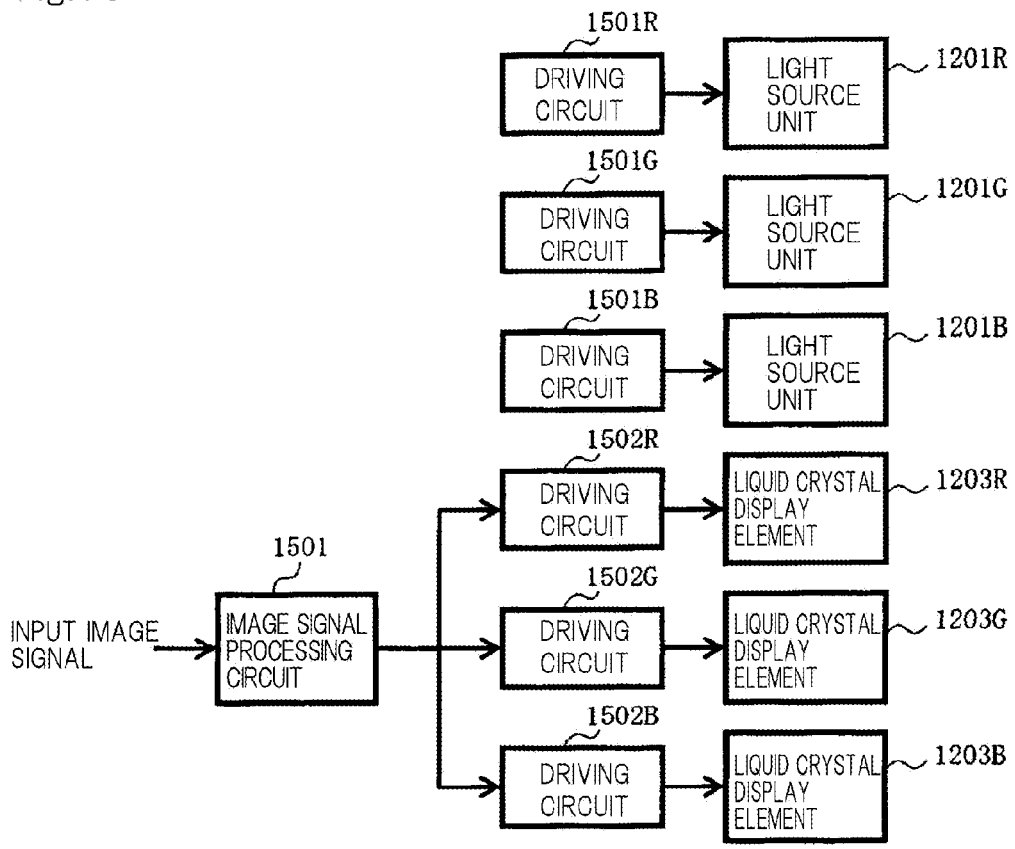
FIG. 15 is a diagram showing the configuration of a driving system of the image display apparatus shown in FIG. 12.

FIG. 15 is a diagram showing the configuration of a driving system of the image display apparatus shown in FIG. 12.

Light source units 1201R, 1201G, and 1201B are turned on into a lit-up state by being driven by driving circuits 1501R, 1501G, and 1501B. It is noted that since light source units 1201R, 1201G, and 1201B are always kept in a lit-up state during image display operation, they may be driven by a single driving circuit.

Image signal processing circuit 1501 creates signals indicating an image for red color, image for green color, and image for blue color according to input image signals provided from an external PC (personal computer) and an image reproducing apparatus, etc. to supply them to driving circuits 1502R, 1502G, and 1502B, and liquid crystal display apparatuses 1203R, 1203G, and 1203B forms an image for red color, image for green color, and image for blue color by being driven by driving circuits 1502R, 1502G, and 1502B.

Figure 16:
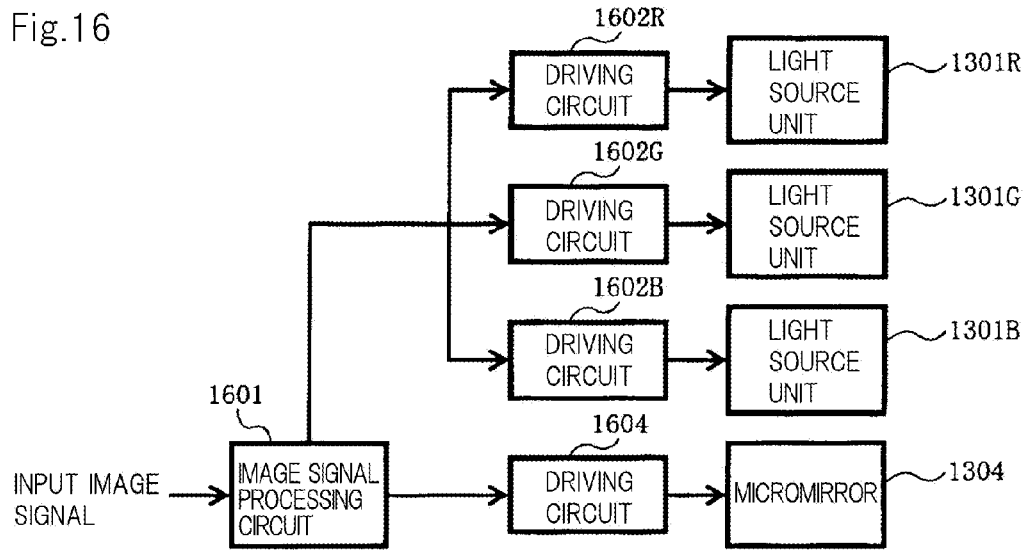
FIG. 16 is a diagram showing the configuration of a driving system of the image display apparatus shown in FIG. 13.

FIG. 16 is a diagram showing the configuration of a driving system of the image display apparatus shown in FIG. 13.

Image signal processing circuit 1601 creates image for red color, image for green color, and image for blue color according to input image signals provided from an external PC and an image reproducing apparatus, etc. to drive micromirror 1304 via driving circuit 1604 such that these images are successively formed. Concurrently with this, driving circuits 1602R, 1602G, and 1602B are controlled such that the light source unit for the image color that has been formed is lit up among light source units 1301R, 1301G, and 1301B.

Figure 17:
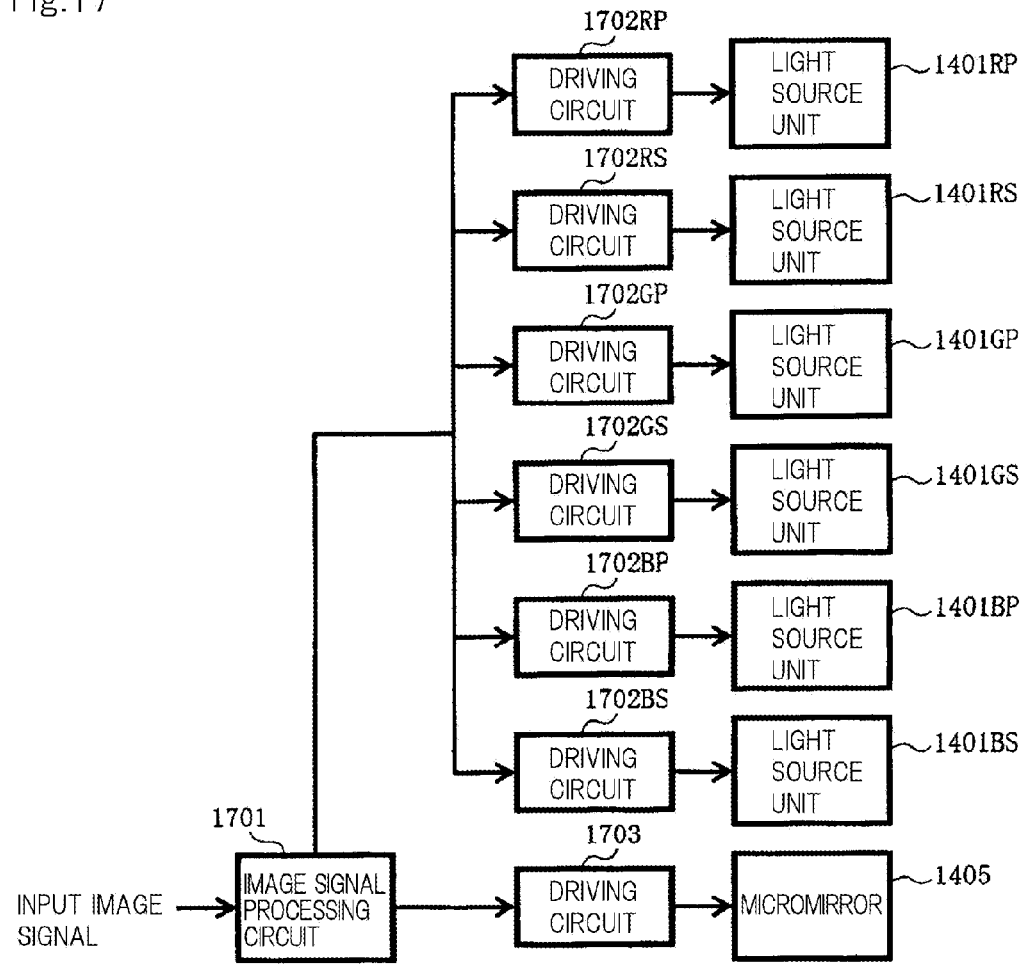
FIG. 17 is a diagram showing the configuration of a driving system of the image display apparatus shown in FIG. 14.

FIG. 17 is a diagram showing the configuration of a driving system of the image display apparatus shown in FIG. 14.

Image signal processing circuit 1701 creates image for red color, image for green color, and image for blue color according to input image signals provided from an external PC and an image reproducing apparatus, etc. to drive micromirror 1405 via driving circuit 1703 such that these images are successively formed. Concurrently with this, driving circuits 1702RP, 1702RS, 1702GP, 1702GS, 1702BP and 1702BS are controlled such that the light source unit for the image color that has been formed is lit up among light source units 1401RP, 1401RS, 1401GP, 1401GS, 1401BP, and 1401BS.

Figure 18A:
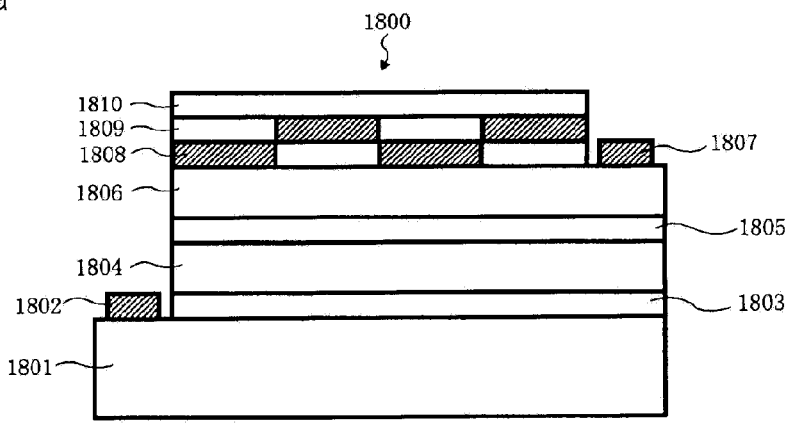
FIG. 18a is a cross-sectional view showing the configuration of another exemplary embodiment of a light emitting element.

FIG. 18a is a cross-sectional view showing the configuration of another exemplary embodiment of a light emitting element.

In light emitting element 1800 of the present exemplary embodiment as well, since the actual thicknesses of individual layers are very thin and the differences in the thickness between respective layers are very large, it is difficult to draw a picture of each layer at an accurate scale and proportion. For this reason, each layer is not drawn to an actual scale in the drawings, and instead, each layer is schematically shown.

P-type electrode 1802 made up of Ni/Au/Ti/Au and reflection layer 1803 made up of Ag are formed on submount 1801 which is made of Si.

P-type semiconductor layer 1804 which is made of GaN doped with Mg, active layer 1805 in which GaN and InGaN are alternately stacked to constitute a multiple quantum well, and N-type type semiconductor layer 1806 which is made of GaN doped with Si are stacked in order on reflection layer 1803. N-type electrode 1807 made up of Ti/Al/Ti/Au, and polarizer layer 1808 are formed on N-type semiconductor layer 1806, and further quarter-wave plate layer 1809 and quarter-wave plate layer 1810 are provided on polarizer layer 1808.

The method of fabricating light emitting element 1800 will be described. First, N-type semiconductor layer 1806, active layer 1805, P-type semiconductor layer 1804, and reflection layer 1803 are formed on a substrate. Next, reflection layer 1803 is bonded to submount 1801 to remove the substrate. Next, polarizer layer 1808 is formed on N-type semiconductor layer 1806. Quarter-wave plate layer 1809 and quarter-wave plate layer 1810 are formed by a separate process, and bonded onto polarizer layer 1808. Lastly, P-type electrode 1802 and N-type electrode 1807 are formed.

The outline operation of the present exemplary embodiment will be described. Applying a voltage between P-type electrode 1802 and N-type electrode 1807 to pass an electric current between them will result in light being generated at active layer 1805. The light generated at active layer 1805 contains components which are oriented in various directions.

Figure 18B:
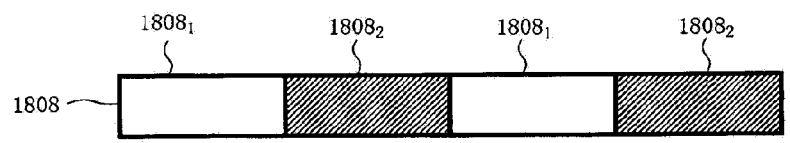
FIG. 18b is a diagram showing the configuration of another exemplary embodiment of the light emitting element, which is a cross-sectional view showing the configuration of polarizer layer 1808 in FIG. 18a in more detail.
Figure 18C:
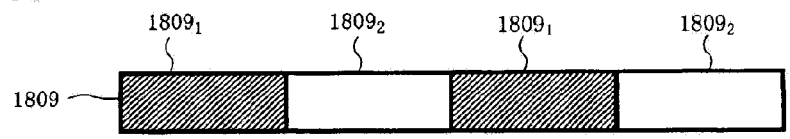
FIG. 18c is a diagram showing the configuration of another exemplary embodiment of the light emitting element, which is a cross-sectional view showing the configuration of quarter-wave plate layer 1809 in FIG. 18a in more detail.

FIGS. 18b and 18c are cross-sectional views showing the configurations of polarizer layer 1808 and quarter-wave plate layer 1809 in FIG. 18a in more detail.

As shown in FIGS. 18b and 18c, both polarizer layer 1808 and quarter-wave plate layer 1809 respectively include a first region and a second region.

First region $1808_1$ and second region $1808_2$ of polarizer layer 1808 are provided so as to correspond to first region $1809_1$ and second region $1809_2$ of quarter-wave plate layer 1809 with respect to the emitted light of light emitting element 1800.

First region $1808_1$ of polarizer layer 1808 transmits polarized light in the first direction and reflects other light. Second region $1808_2$ of polarizer layer 1808 transmits polarized light in the second direction, which is orthogonal to the polarized light in the first direction, and reflects other light. While the light reflected at polarizer layer 1808 is reflected at reflection layer 1803 toward polarizer layer 1808, at this moment, the light is reflected at a certain angle, and therefore it reenters polarizer layer 1808 at a position different from the reflection position. For this reason, the light that has reentered polarizer layer 1808 includes light that passes through polarizer layer 1808.

First region $1809_1$ and second region $1809_2$ of quarter-wave plate layer 1809 are configured to allow incident light to exit after giving a phase difference of a quarter wavelength to two orthogonal polarization components of the incident light, and the first region and the second region respectively give a phase difference of an opposite sign to two orthogonal polarization components of incident light.

As described above, since orthogonal linearly polarized lights enter into first region $1809_1$ and second region $1809_2$ of quarter-wave plate layer 1809, the exiting lights thereof are aligned in circularly polarized lights which rotate in the same direction.

Quarter-wave plate layer 1810 gives a phase difference of a quarter wavelength to two orthogonal polarization components of the circularly polarized light exited by quarter-wave plate layer 1809 and allows the same to exit as a linearly polarized light.

A specific configuration of polarizer layer 1808 that constitutes light emitting element 1800 may include the configurations shown in FIGS. 2, 3, 6, and 7. Moreover, a specific configuration of quarter-wave plate layer 1809 may include the configurations shown in FIGS. 18d and 18e.

Figure 18D:
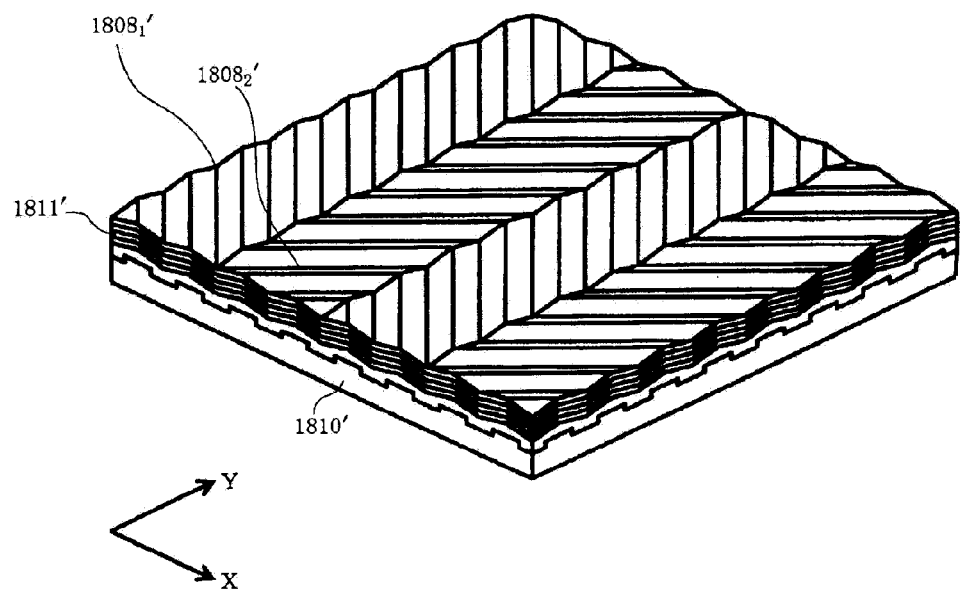
Figure 18E:
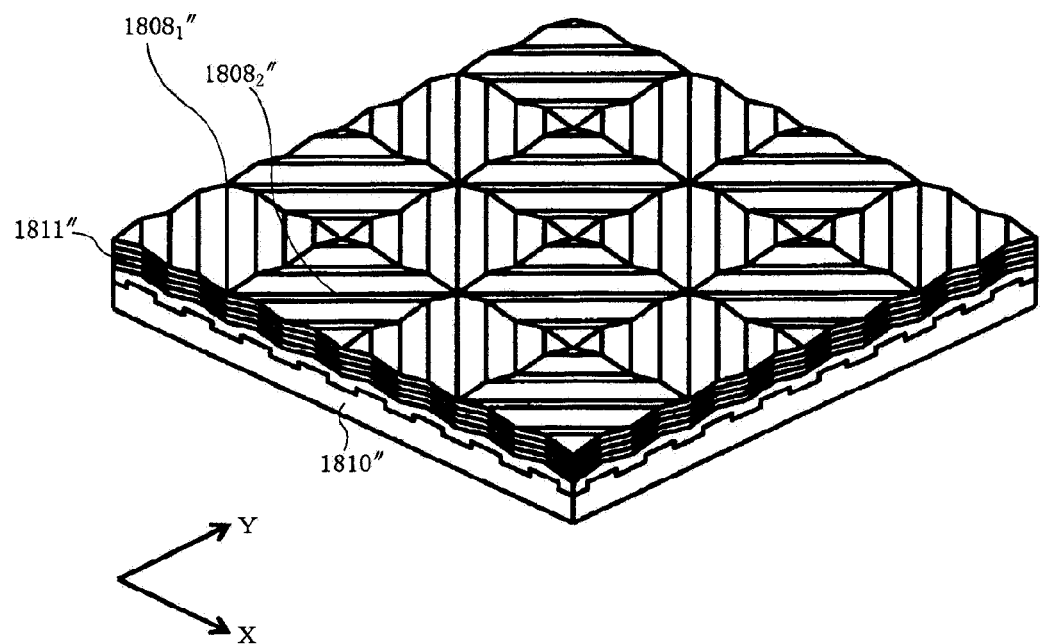

In the examples shown in FIGS. 18d and 18e, dielectrics 1811' and 1811" in which $SiO_2$ and $TiO_2$ are alternately stacked are formed on substrates 1810' and 1810" which are made of quartz. Dielectrics 1811' and 1811" are provided with first regions $1808_1'$ and $1808_1"$, and second regions $1808_2'$ and $1808_2"$.

Since first regions $1808_1'$ and $1808_1"$ and second regions $1808_2'$ and $1808_2"$ have a periodic structure, which has a periodic concavo-convex shape in one direction, and a uniform shape in the direction orthogonal thereto, in the XY plane as disclosed in JP2001-51122A, they act as a quarter-wave plate.

In the example shown in FIG. 18d, the first region and the second region are arranged in a striped pattern, and in the example shown in FIG. 18e, the first region and the second region are arranged in a staggered pattern.

Moreover, the image display apparatus using light emitting element 1800 may include the configurations shown in FIGS. 12 to 17.

Further, the relationship between the relative period and the angular width, which have been described by using FIGS. 10 and 11, is maintained in light emitting element 1800 of the present exemplary embodiment as well.

The present application claims priority of Japanese Patent Application No. 2009-243367 filed on Oct. 22, 2009, which is herein incorporated by reference in its entirety.

REFERENCE SIGNS LIST
100 Light emitting element
101 Submount
102 P-type electrode
103 Reflection layer
104 P-type semiconductor layer
105 Active layer
106 N-type semiconductor layer
107 N-type electrode
108 Polarizer layer
109 half-wave plate layer

The invention claimed is:
1. A light emitting element including an active layer for generating light, the light emitting element comprising:
a polarizer layer including a first region that transmits polarized light in a first direction and reflects other light from among the light generated at the active layer, and a second region that transmits polarized light in a second direction orthogonal to the first direction and reflects other light from among light generated at the active layer;
a wave plate layer including a third region and a fourth region that allows the lights exited from the first region and the second region to enter, and to exit as light in a same polarization state; and a reflection layer that reflects the lights reflected at the first region and the second region.

2. The light emitting element according to claim 1, wherein the first region and the second region, and the third region and the fourth region are adjacently arranged in a striped pattern.

3. The light emitting element according to claim 1, wherein the first region and the second region, and the third region and the fourth region are adjacently arranged in a staggered pattern.

4. The light emitting element according to claim 1, wherein the third region and the fourth region allow an incident light to exit after respectively giving a different polarization rotation angle thereto.

5. The light emitting element according to claim 4, wherein the fourth region allows incident light to exit after adding a polarization rotation angle of 90 degrees to the polarization rotation angle of the incident light which is given thereto at the third region.

6. The light emitting element according to claim 1, wherein the third region and the fourth region respectively give a different phase difference to two orthogonal polarization components of the incident light and allow the same to exit as circularly polarized light.

7. The light emitting element according to claim 1, wherein when letting P be a sum of widths of the first region and the second region, L1 be the distance between a center in thickness direction of the polarizer layer and a center in thickness direction of the reflection layer, and L2 be the distance from a center in thickness direction of the active layer to the center of the polarizer layer, $P/(2L1+L2)$ is within the range 0.9 to 6.5.

8. The light emitting element according to claim 7, wherein $P/(2L1+L2)$ is within the range 1.2 to 4.5.

9. The light emitting element according to claim 7, wherein $P/(2L1+L2)$ is 2.3.

10. A image display apparatus is provided that uses the light emitting element according to claim 1.

* * * * *